United States Patent
Zanchi et al.

(10) Patent No.: US 12,431,910 B2
(45) Date of Patent: Sep. 30, 2025

(54) SINGLE EVENT EFFECT DETECTION AND CIRCUMVENTION IN ADCs

(71) Applicant: The Boeing Company, Arlington, VA (US)

(72) Inventors: Alfio Zanchi, Seattle, WA (US); Casey Gooch, Seattle, WA (US)

(73) Assignee: The Boeing Company, Arlington, VA (US)

( * ) Notice: Subject to any disclaimer, the term of this patent is extended or adjusted under 35 U.S.C. 154(b) by 270 days.

(21) Appl. No.: 18/348,994

(22) Filed: Jul. 7, 2023

(65) Prior Publication Data

US 2025/0015809 A1 Jan. 9, 2025

(51) Int. Cl.
  *H03M 1/06* (2006.01)
  *H03M 1/10* (2006.01)
  *H03M 1/34* (2006.01)
  *H03M 1/48* (2006.01)

(52) U.S. Cl.
  CPC .......... *H03M 1/0604* (2013.01); *H03M 1/10* (2013.01); *H03M 1/1009* (2013.01); *H03M 1/34* (2013.01); *H03M 1/48* (2013.01)

(58) Field of Classification Search
  CPC .... H03M 1/0604; H03M 1/1009; H03M 1/10; H03M 1/34; H03M 1/48
  See application file for complete search history.

(56) References Cited

U.S. PATENT DOCUMENTS 9,444,480 B1 * 9/2016 Zanchi ................ H03M 1/1061
9,929,739 B1    3/2018 Zanchi

OTHER PUBLICATIONS

Berg, M et al., "Enhancing Observability of Signal Composition and Error Signatures During Dynamic SEE Analog to Digital Device Testing," IEEE Transactions on Nuclear Science, vol. 57, No. 4, Aug. 16, 2010, 8 pages.

Budroweit, J et al., "Heavy Ion Induced Single Event Effects Characterization on an RF-Agile Transceiver for Flexible Multi-Band Radio Systems in NewSpace Avionics," Aerospace, vol. 7, No. 2, Feb. 9, 2020, 20 pages.

Gatti, U et al., "Radiation-hardening methodologies for flash ADC," Analog Integrated Circuits and Signal Processing, vol. 87, No. 2, Sep. 1, 2015, 14 pages.

European Patent Office, Extended European Search Report Issued in Application No. 24170730.6, Oct. 16, 2024, Germany, 8 pages.

(Continued)

*Primary Examiner* — Joseph J Lauture
(74) *Attorney, Agent, or Firm* — Alleman Hall & Tuttle LLP

(57) ABSTRACT

Examples are disclosed that relate to detection of single event effects on an analog-to-digital converter. In one example, an electronic device includes an analog-to-digital converter and an event detection engine co-located on the same integrated circuit. The analog-to-digital converter is configured to receive an analog signal and output a set of digital signals representative of the analog signal. The event detection engine is configured to receive the set of digital signals from the analog-to-digital converter, and for each digital signal of the set of digital signals, compare a magnitude of the digital signal with a threshold, and output an error signal indicating a single-event error of the analog-to-digital converter based at least on the magnitude of the digital signal exceeding the threshold.

20 Claims, 7 Drawing Sheets

(56) References Cited

OTHER PUBLICATIONS

Berg, M. et al., "Heavy Ion SEE Tests for Texas Instruments ADS5483 ADC," NASA Goddard Space Flight Center Test Report, 2009, 30 pages.

Buchner, S. et al., "Single Event Effects Testing of ADC14155WG-MLS Analog-to-Digital Converter (National Semiconductor)," NASA Test Report, May 6, 2009, 22 pages.

Campola, M. et al., "Single Event Effects (SEE) Testing of the 7872ARPFS 14-bit Analog to Digital Converter," NASA Goddard Space Flight Center Test Report, Sep. 23, 2010, 8 pages.

Chen, D. et al., "Total-Ionizing Dose and Single-Event Effect Test Results of Analog and Mixed Signal Devices from Analog Devices," Proceedings of the 2018 IEEE Radiation Effects Data Workshop, Jul. 16, 2018, Waikoloa, HI, 8 pages.

Kruckmeyer, K. et al., "Single Event Upset Characterization of GHz Analog to Digital Converters with Dynamic Inputs Using a Beat Frequency Test Method," Proceedings of the 2007 IEEE Radiation Effects Data Workshop, Jul. 23, 2007, Honolulu, HI, 5 pages.

Stepanović, D. et al., "A 2.8 GS/s 44.6 mW Time-Interleaved ADC Achieving 50.9 dB SNDR and 3 dB Effective Resolution Bandwidth of 1.5 GHz in 65 nm CMOS," IEEE Journal of Solid-State Circuits, vol. 48, No. 4, Jan. 28, 2013, 12 pages.

Zanchi, A. et al., "A Comprehensive Methodology to Rate SETs of Complex Analog and Mixed-Signal Circuits Demonstrated on 16-bit A-to-D Converters," IEEE Transactions on Nuclear Science, vol. 59, No. 6, Dec. 2012, 9 pages.

Zanchi, A. et al., "Single-Event Effects Characterization of a 12-bit 200MSps A-to-D Converter in 32nm SOI CMOS with MilliBeam™ and Broad-Beam Heavy-Ions," Proceedings of the 2017 IEEE Radiation Effects Data Workshop, Jul. 17, 2017, New Orleans, LA, 8 pages.

\* cited by examiner

SINGLE EVENT EFFECT DETECTION AND CIRCUMVENTION IN ADCs

GOVERNMENT LICENSE RIGHTS

This invention was made with United States Government (USG) support. The Government has certain rights in the invention.

FIELD

The present disclosure relates generally to the field of electronic circuitry, and more specifically to analog-to-digital converters.

BACKGROUND

Electronic circuits are a powerful and efficient way of processing data and are used in many ground-based and space-based apparatuses. A special class of ground-based applications (military, medical, and energy/nuclear applications) as well as space-based applications are subject to a number of functional challenges stemming from radiation environments. One such problem is the possibility of malfunction of the electronic circuit due to heavy ion particle interactions, referred to as Single-Event Effects (SEEs).

Within the realm of electronic circuits, analog-to-digital and digital-to-analog converters (ADCs and DACs, respectively) bridge the gap between analog operation and efficient digital processing, which leverages the programmability of microprocessors, microcontrollers, FPGAs, DSP cores, and other digital electronics for increased computing performance. However, much like other analog circuits, ADCs are susceptible to radiation events such as SEEs. One complicating issue is that different ADC architectures are subject to different behavior upsets depending on where, at what exact instant, and in what ADC state the radiation event occurs. It can be difficult to detect and classify such behavior upsets of an ADC due to radiation events, even in general. More particularly, though, it is difficult to detect and classify such behavior upsets of an ADC fast enough to perform appropriate mitigation operations to mitigate the effects of the radiation event.

SUMMARY

Examples are disclosed that relate to detection of single event effects on an analog-to-digital converter. In one example, an electronic device includes an analog-to-digital converter and an event detection engine co-located on the same integrated circuit. The analog-to-digital converter is configured to receive an analog signal and output a set of digital signals representative of the analog signal. The event detection engine is configured to receive the set of digital signals from the analog-to-digital converter, and for each digital signal of the set of digital signals, compare a magnitude of the digital signal with a threshold, and output an error signal indicating a single-event error of the analog-to-digital converter based at least on the magnitude of the digital signal exceeding the threshold.

The features, functions, and advantages that have been discussed can be achieved independently in various embodiments or may be combined in yet other embodiments, further details of which can be seen with reference to the following description and drawings.

DETAILED DESCRIPTION

Figure 1:
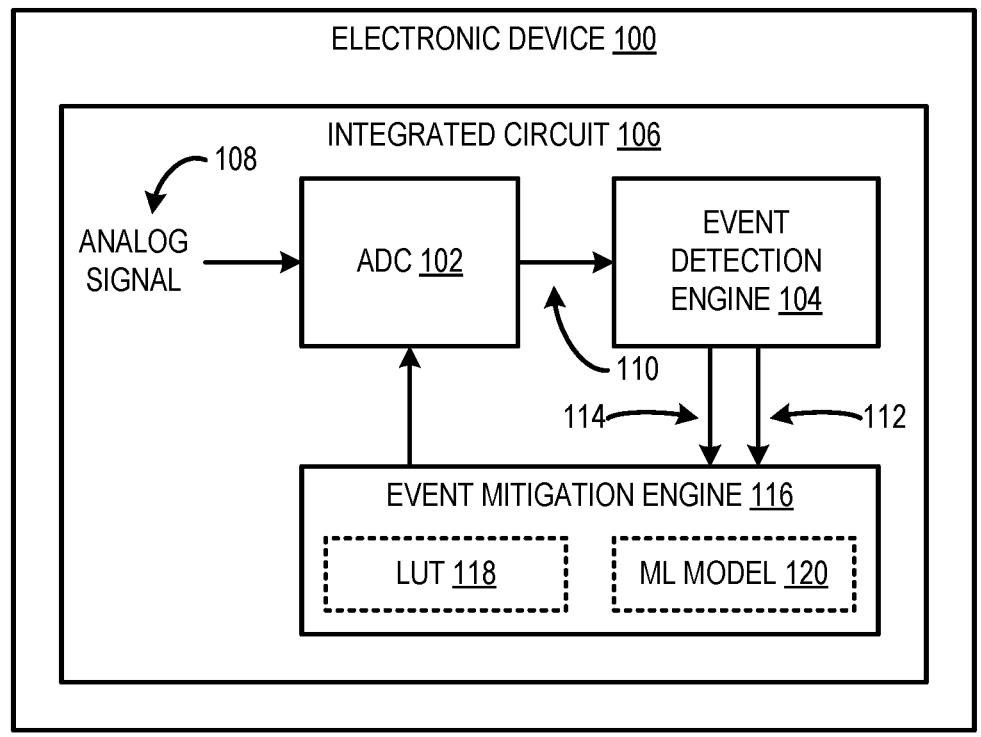
FIG. 1 schematically shows an example electronic device including an event detection engine configured to detect single event effects on a high-speed analog-to-digital converter in real-time.

Analog-to-digital converters (ADCs) are susceptible to radiation events, such as Single-Event Effects (SEEs). A conventional approach for detecting and logging such radiation events requires a posteriori batch processing of ADC signal data using off-chip processing (e.g., via a field programmable gate array (FPGA)). Such a conventional approach adds considerable cost and complexity to an electronic device due to the addition of the FPGA or other suitable processing hardware. Further, such a conventional approach increases power consumption of an electronic device due to having to provide electrical power to the FPGA or other suitable processing hardware. Moreover, since such a conventional approach requires off-chip processing of ADC signal data, the observation time in which the ADC is actively generating signal data susceptible to corruption by radiation is reduced, due to having to dedicate resources to transferring ADC signal data from on-chip internal memory to the off-chip FPGA or other suitable processing hardware, which normally operates at much lower data rate than the ADC itself.

To address these and other issues discussed herein, the present disclosure is directed to an approach for detecting radiation events, such as SEEs, on an ADC in real time. In one example, an electronic device includes an ADC and an event detection engine co-located on the same integrated circuit. The ADC is configured to receive an analog signal and output a set of digital signals representative of the analog signal. The event detection engine is configured to receive the set of digital signals from the ADC, and for each digital signal of the set of digital signals, compare a magnitude of the digital signal with a threshold, and output an error signal indicating a single-event error of the analog-to-digital converter based at least on the magnitude of the digital signal exceeding the threshold.

In typical implementations, the circuitry of the event detection engine can be co-located on the same integrated circuit as the ADC and allow for real-time processing of the ADC signal data to detect upsets in operation of the ADC due to radiation events. Such real-time, on-chip processing provides the technical benefit of increasing the observation window of the ADC (e.g., virtually 100% of the allowable time) relative to conventional approaches where processing resources have to be dedicated to transferring ADC signal data off-chip to be batch processed by an FPGA or other suitable processing hardware, which normally operates at much lower data rate than the ADC itself.

Furthermore, the real-time detection approach enables transparent radiation event background monitoring and statistics accumulation, for both radiation assurance purposes and practical on-demand mitigation of the effects of the radiation events on the ADC. As will be discussed in further detail herein, different radiation error/event detection data logging methods can be employed that balance memory usage and data sampling in a format that is conducive to SEE analysis and debugging for circumvention and mitigation of the detected radiation events.

FIG. 1 schematically shows an example electronic device 100 including an ADC 102 and an event detection engine 104 co-located on the same integrated circuit 106. The ADC 102 normally operates to receive an analog signal 108 and output a set of digital signals 110 representative of the analog signal 108. In some embodiments, the ADC 102 is configured such that the digital signals in the set of digital signals 110 represent a plurality of constant levels, or substantially amplitude-bounded signals steady over time. In some embodiments, the digital signals in the set of digital signals 110 represent a plurality of constant levels, or substantially amplitude-bounded signals, for a designated time window (e.g., periodically). In particular, the ADC 102 can be configured to sample the analog signal 108 with a coherent, or locked sampling rate that allows for the same point of the periodic analog input signal to be digitized over and over again to produce an equivalent (aliased) DC output corresponding to each digital signal in the set of digital signals 110. In other words, the ADC 102 outputs evenly spaced "samples" in the form of the digital signals 110 that can be compared against static threshold(s) to detect radiation events, such as SEEs.

In some embodiments, the set of digital signals 110 can be attained by the ADC 102 from DC analog inputs (e.g., TV signal synch frames, or pilot tone time slots). In other embodiments, a clock signal can be conditioned and synchronously routed to the input of the ADC 102 to generate the set of digital signals 110. In still other embodiments, the set of digital signals 110 can be attained by the ADC 102 from a non-periodic random (NPR) noise-like signal that exhibits characteristics similar to noise but is non-periodic in nature.

The ADC 102 may be configured to convert virtually any type of analog signal into the set of digital signals 110. Further, note that the ADC 102 may be configured such that the output is not solely DC all of the time.

Each digital signal output by the ADC 102 includes a multi-bit number representing the magnitude of the digitized sample of the analog signal 108. The magnitude of each digital signal can match the resolution of the ADC 102. In one example, the magnitude is represented by a 12-bit number. In some examples, each digital signal is encoded as a 2's complement binary encoding (e.g., in the range of −2048 to +2047, in the case of a 12-bit number).

In some embodiments, the event detection engine 104 (or another engine co-located on the same integrated circuit 106) is configured to group the set of digital signals 110 into a frame (e.g., 128 digital signals per frame). Further, in some embodiments, the event detection engine 104 (or another engine co-located on the same integrated circuit 106) is configured to output one or more frames of digital signals all at once to hardware located off-chip from the integrated circuit 106. In one example, the frame(s) of digital signals are transferred off-chip at a transmission rate that is slower than the sampling rate of the ADC 102 in a first-in first-out (FIFO) fashion.

In some embodiments, the ADC 102 is configured as a high-speed ADC. In one example, the high-speed ADC produces at least one billion samples of digital signals per second, or 1 Giga-samples/second.

The event detection engine 104 is configured to receive the set of digital signals 110 (and/or the frame) from the ADC 102. The event detection engine 104 is configured to, for each digital signal of the set of digital signals 110, compare a magnitude of the digital signal with a threshold. The coherent sampling performed by the ADC produces consistent digital output during normal operation that allows for the threshold to be established around a level of acceptable output (approximately the DC level+some level of noise) that is sufficiently separated from radiation-induced violations that would exceed the threshold. The event detection engine 104 is configured to, for each digital signal of the set of digital signals 110, output an error signal 112 indicating a single-event error of the ADC 102 based at least on the magnitude of the digital signal exceeding the threshold.

Since the event detection engine 104 and the ADC 102 are co-located on the same integrated circuit 106, the event detection engine 104 can process the digital signal 110 even when the ADC 102 is a high-speed ADC that produces digital signals at a significantly high rate, such as 1 Giga-samples/second.

In some embodiments, the event detection engine 104 is configured to establish a plurality of thresholds to detect various radiation-induced violations. In one example, the event detection engine 104 is configured to establish a ceiling threshold and a floor threshold that are each offset from a DC level output from the ADC by a designated level of acceptable noise. In some examples, the ceiling and floor thresholds have the same offset relative to the DC level. In other examples, the ceiling and floor thresholds have different offsets relative to the DC level depending on the design of the ADC 102. The event detection engine 104 is configured to compare the magnitude of each digital signal of the set of digital signals 110 with a digital word corresponding to the ceiling and floor thresholds. The event detection engine 104 is configured to output the error signal 112 indicating the single-event error of the ADC 102 based at least on the magnitude of the digital signal being greater than the corresponding ceiling threshold or less than the corresponding floor threshold. In this case, the ceiling and floor thresholds cooperatively form a guard band that defines normal operation of the ADC 102. When a digital signal goes outside of the guard band, it is interpreted as an indication of an error caused by SEEs on the ADC 102, and the error is detected/flagged via the error signal 112.

In some embodiments, the event detection engine 104 can be configured to establish additional thresholds at different levels (positive and/or negative). In one example, the event detection engine 104 can be configured to set a first positive threshold and a second positive threshold that is greater than the first positive threshold. Likewise, the event detection engine 104 can be configured to set a first negative threshold and a second negative threshold that is less than the first negative threshold. These different thresholds can be tailored to detect/identify different types of errors and/or events based on the magnitude of the digital signals, and increase the degree of insight into the shape and nature of the radiation upset. In some cases, such event detection allows for the creation of whole families of Weibull curves that can be analyzed, at runtime or also a posteriori in batch mode, to perform various circumvention/mitigation operations. The event detection engine 104 may be configured to establish any suitable number of thresholds at different magnitudes to detect/identify, and ultimately classify different types of radiation events.

The event detection engine 104 is further configured to output an event signal 114 indicating that an event occurred within a frame, based at least on a change of the error signal 112 between adjacent digital signals in the frame. While an "error" pertains to each individual digital signal/sample, an "event" correspondingly pertains to an entire frame. An "event" is defined as a change of error status between adjacent samples within a frame. Examples of events detected by the event detection engine 104 include a ceiling error in one sample but not in the next; a floor error after a sample without any error; a ceiling error in one sample and a floor error in the next; or any combination or repetition of those. Example sequences that are not classified as events include a frame having no errors, a frame having all ceiling errors, and a frame having all floor errors. In each of these examples, all samples in the frame have the same error status.

The electronic device 100 further comprises an event mitigation engine 116 that is configured to receive the event signal 114 from the event detection engine 104 (and/or event data logged by the event detection engine 104). The event mitigation engine 116 is configured to perform a mitigation operation based at least on the event signal 114 indicating that an event occurred within a frame. The event mitigation engine 116 may determine which type of mitigation operation to perform based on the event data detected for the frame flagged as including an event. The mitigation operation may be selected to mitigate disruption on the operation of the electronic device 100 from the radiation event detected by the event detection engine 104.

The mitigation operation can take various forms depending on the type of radiation event that is detected. In one example, the event mitigation engine 116 is configured to identify a running count of radiation events that intensifies within a relatively short time interval (e.g., increasing magnitudes of samples beyond a threshold over a consecutive series of frames, as tracked by timestamps) and temporarily shuts down the ADC 102 or initiates a reset of the ADC 102 based on the identified pattern or signature of detected radiation events. In another example, the event mitigation engine 116 is configured to ignore or delete ADC signal data that is produced by the ADC 102 during a radiation event that is detected by the event detection engine 104. In yet another example, the event mitigation engine 116 is configured to predict an oncoming radiation event based at least on the error signal 112, the event signal 114, and/or event data logged by the event detection engine 104 and perform a mitigation operation (e.g., shutting down the ADC 102) before the prominent part of the radiation event occurs, or peaks.

The event mitigation engine 116 may be configured to perform any suitable mitigation operation on the ADC 102 and/or the electronic device 100 based at least on the event signal 114 and/or event data logged by the event detection engine 104. Since the event mitigation engine 116 is co-integrated on the same integrated circuit 106 as the ADC 102, a number of ADC settings can be adjusted/controlled by the event mitigation engine 116 suitably fast enough to mitigate effects of the radiation events on the ADC 102. In this way, the event mitigation engine 116 can act as a reactive, or as a predictive radiation effect circumvention/mitigation tool.

In some embodiments, the event mitigation engine 116 optionally includes a lookup table (LUT) 118 configured to map event data (and/or the event signal 114) corresponding to different types of events to different types of mitigation operations. The event mitigation engine 116 is configured to provide the event data corresponding to an event as input to the LUT 118 and perform a mitigation operation output from the LUT 118 based at least on the event data for the event detected by the event detection engine 104.

In some embodiments, the event mitigation engine 116 optionally includes a machine learning model 120 previously-trained to select a mitigation operation from a plurality of different mitigation operations based at least on event data (and/or the event signal 114) corresponding to different types of events. The event mitigation engine 116 is configured to perform the mitigation operation output from the machine learning model 120 based at least on the event data for the event detected by the event detection engine 104.

The event mitigation engine 116 may be configured to select a mitigation operation from a plurality of different mitigation operation that is best suited to mitigate the effects of a particular radiation event based at least on the event data received from the event detection engine 104 using any suitable analysis and selection techniques.

Figure 2:
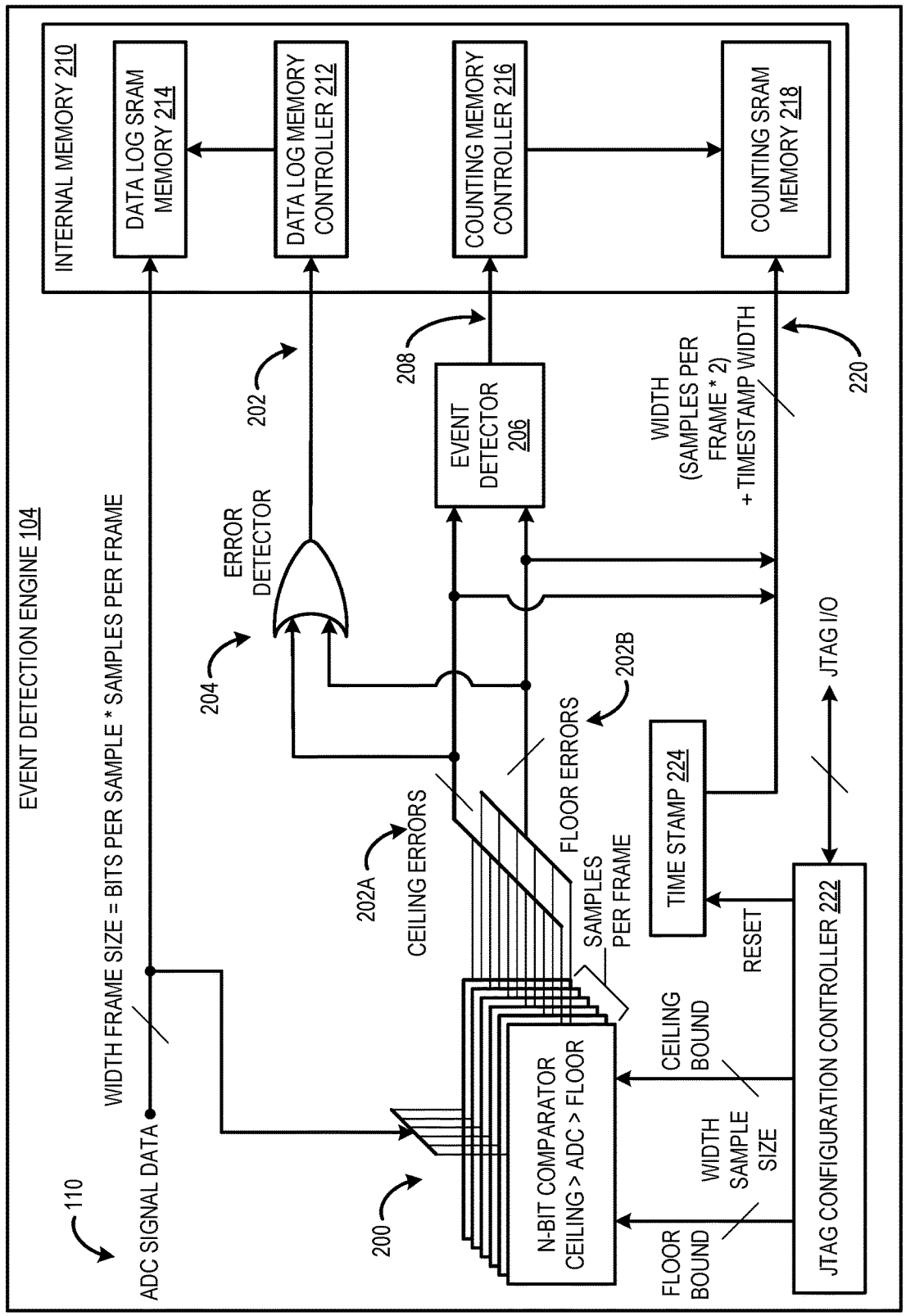
FIG. 2 schematically shows the event detection engine of FIG. 1.

FIG. 2 schematically shows a detailed view of the event detection engine 104 according to one embodiment of the present disclosure. The event detection engine 104 is configured to receive ADC signal data including a set of digital signals 110 representing an analog signal from the ADC 102. In some embodiments, the set of digital signals 110 is grouped into a frame and output from the ADC 102 to the event detection engine 104 altogether. The event detection engine 104 includes a plurality of comparators 200 corresponding to the number of digital signals in the set 110 (or frame). Each comparator of the plurality of comparators 200 is configured to compare the magnitude of the corresponding digital signal to one or more thresholds, and output an error signal 202. In the illustrated embodiment, each comparator is configured to compare the magnitude of the corresponding digital signal to a ceiling threshold and a floor threshold. Magnitudes that exceed the ceiling error threshold are indicated as ceiling errors via ceiling error signals 202A and magnitudes that are less than the floor error threshold are indicated as floor errors via floor error signals 202B.

By integrating the plurality of comparators 200 into the event detection engine 104 on the same integrated circuit 106 as the ADC 102, the plurality of comparators 200 is able to operate at speeds fast enough to keep up with the conversion speed of the ADC, and ideally maintain a full 100% duty cycle without need for signal filtering or decimation. At the same time, the output of the plurality of comparators 200 provides meaningful event data that is capable enough to classify radiation-induced events in a format useful to the operator and conducive to SEEs analysis and mitigation.

The ceiling error signals 202A and the floor error signals 202B are fed as input to an error detector 204 that is configured to output the error signal 202. In the illustrated embodiment, the error detector is configured as an OR gate, to flag an error upon violation of the acceptable signal range in either direction. The error detector 204 outputs the error signal 202 indicating a single-event error of the ADC 102 based at least on the magnitude of the digital signal being greater than the ceiling threshold or less than the floor threshold. In other words, the event detection engine 104 detects an error based at least on a magnitude of a digital signal going outside a guard band having boundaries defined by the ceiling threshold and the floor threshold.

The event detection engine 104 further includes an event detector 206 configured to receive the ceiling error signals 202A and the floor error signals 202B and output an event signal 208 indicating that an event occurred within the frame based at least on a change of the error signals between adjacent digital signals in the frame. In one example, the event detector 206 is embodied as a finite state machine that polls every comparator 200 at the conclusion of every frame and determines whether or not an event has occurred in the frame based on comparing the error statuses of the different digital signals in the frame.

FIGS. 3-9 show example graphs of errors/events that occur within a frame and are detectable by the event detector 206. In each graph, the maximum and minimum possible magnitudes of the digital signals are indicated by solid lines (e.g., at 2047 and −2048 for a N=12-bit case) and the ceiling and floor thresholds are indicated by dotted lines. The labels c-error and f-error identify ceiling-error and floor-error, respectively.

Figure 3:
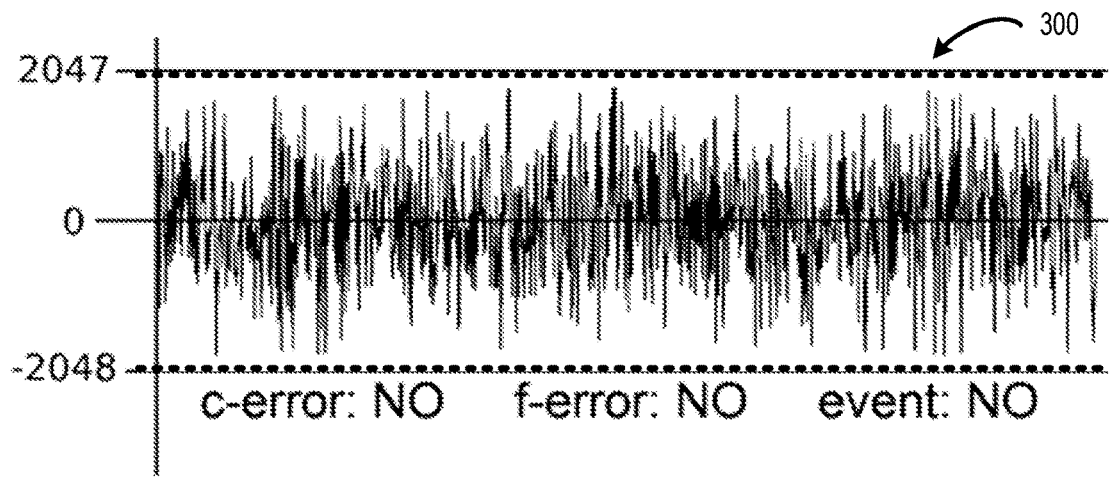
FIGS. 3-9 show example graphs of errors/events that occur within a frame and are detectable by the event detection engine of FIG. 2.

FIG. 3 shows an example graph 300 where the ceiling and floor thresholds are aligned with the maximum and minimum possible magnitudes leaving no space outside their bounds for any error to occur. Therefore, no event can ever be flagged in this example scenario.

Figure 4:
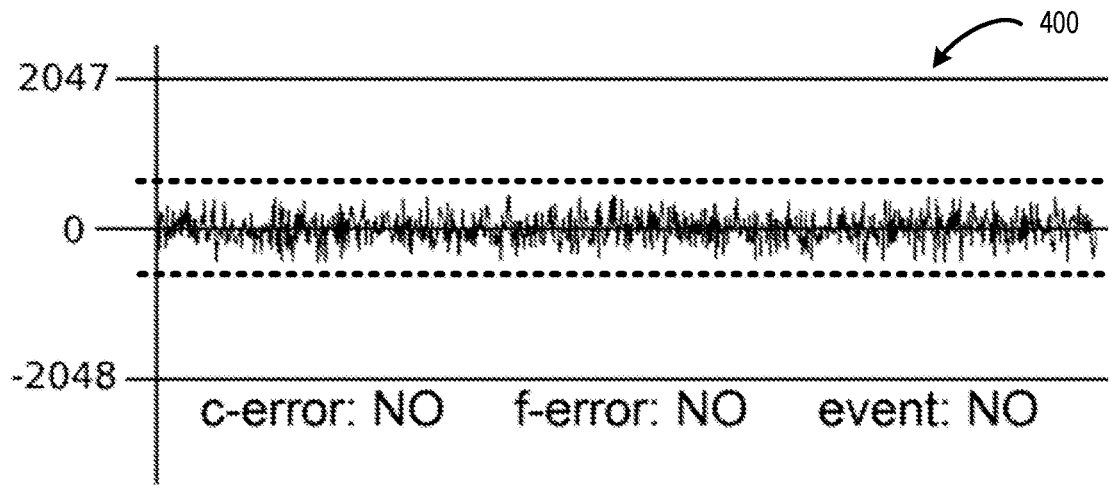

FIG. 4 shows an example graph 400 where the ceiling and floor threshold are pulled in toward the central axis relative to the maximum and minimum possible magnitudes. However, in this example the digital signal remains within the guard bands of the ceiling and floor thresholds, so there are no errors in the frame and the frame is not flagged as an event either.

Figure 5:
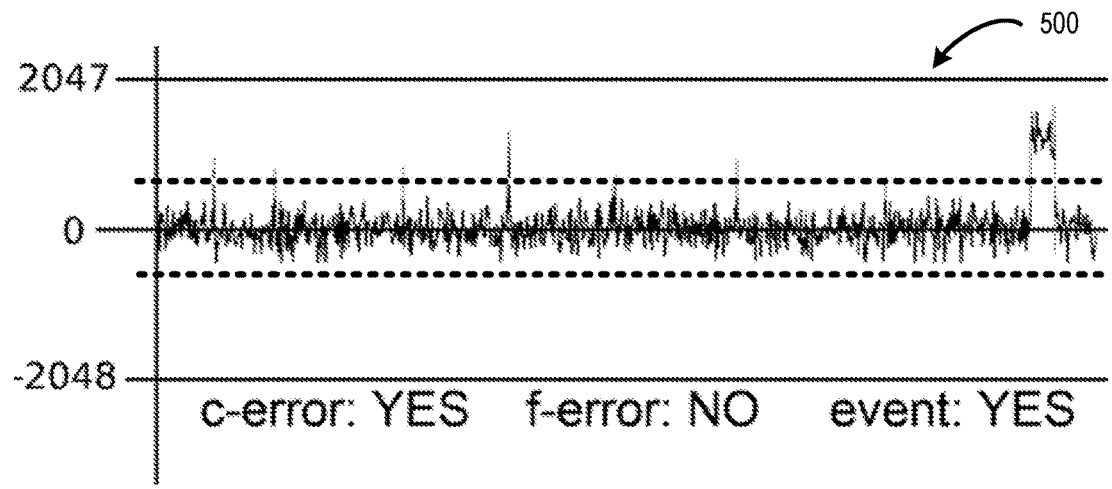

FIG. 5 shows an example graph 500 where the digital signal mostly stays between the ceiling and floor thresholds along the frame. However, the magnitude of the digital signal rises above the ceiling threshold for a duration of at least one sample in approximately seven occasions within the frame. In the final occasion, the magnitude of the digital signal remains above the ceiling threshold for a plurality of samples near the end of the frame. In this example scenario, the frame includes multiple ceiling errors, no floor errors, and the frame is flagged as an event due to the change in error status between adjacent signals on multiple occasions.

Figure 6:
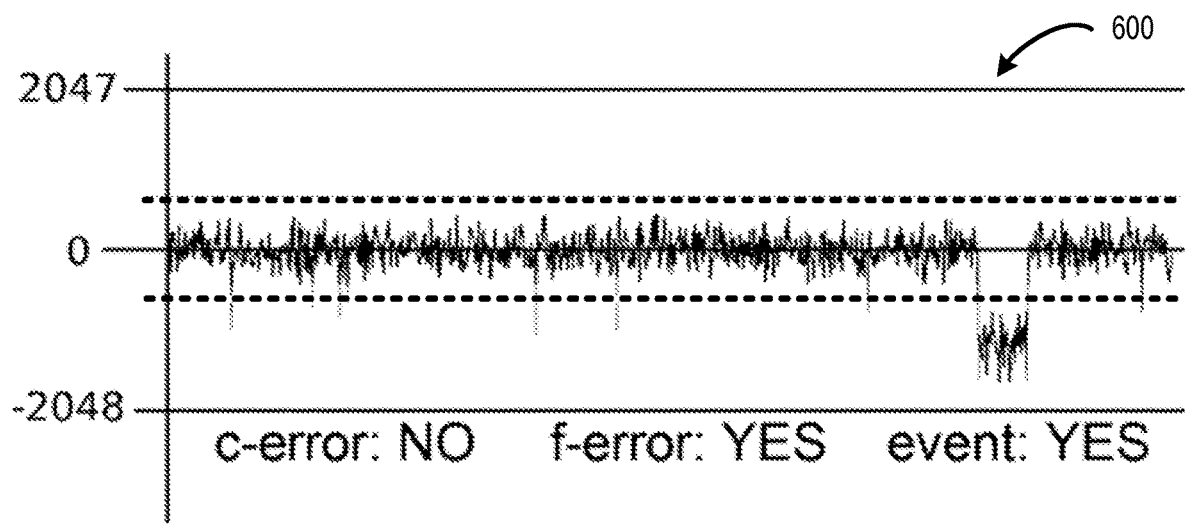

FIG. 6 shows an example graph 600 that is similar to the graph 500 shown in FIG. 5. In this example, the magnitudes of the digital signals fall below the floor threshold for at least one sample in approximately five occasions within the frame. In the final occasion, the magnitude of the digital signal remains below the floor threshold for a plurality of samples near the end of the frame. In this example, the frame includes multiple floor errors, no ceiling errors, and the frame is flagged as an event due to the change in error status between adjacent signals on multiple occasions.

Figure 7:
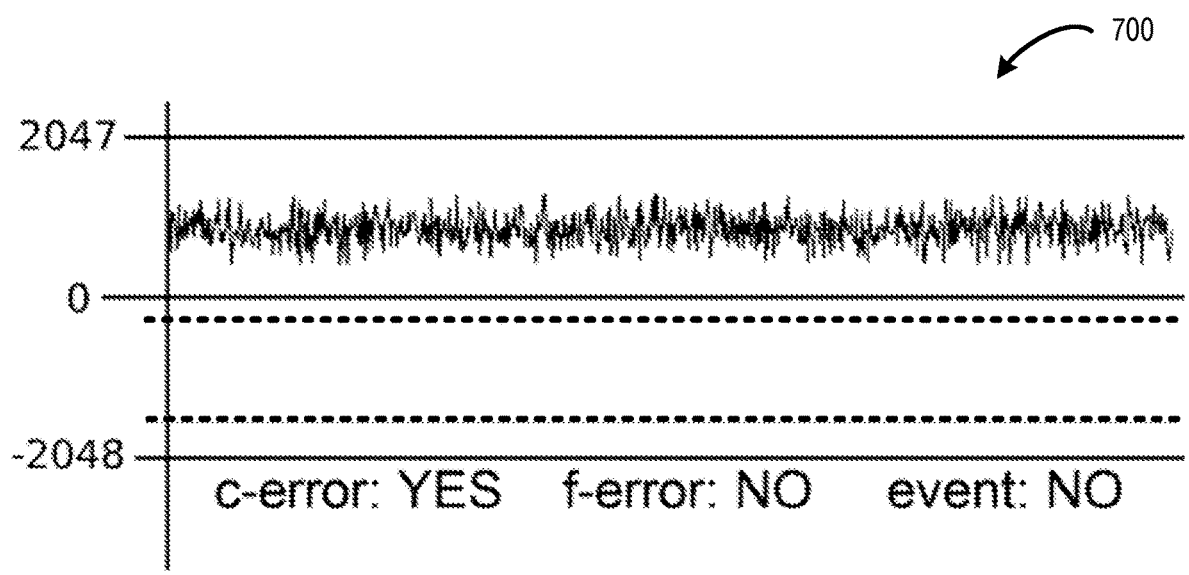

FIG. 7 shows an example graph 700 where the ceiling and floor thresholds are positioned below the zero axis and all the digital signals in the frame are above the zero axis. In this example, the magnitudes of all of the digital signals in the frame are above the ceiling threshold, so every sample is flagged as a ceiling error. However, since there is no change in error status between adjacent samples in frame the error is ongoing and does not start nor end in this frame. As such, the frame is not flagged as event.

Figure 8:
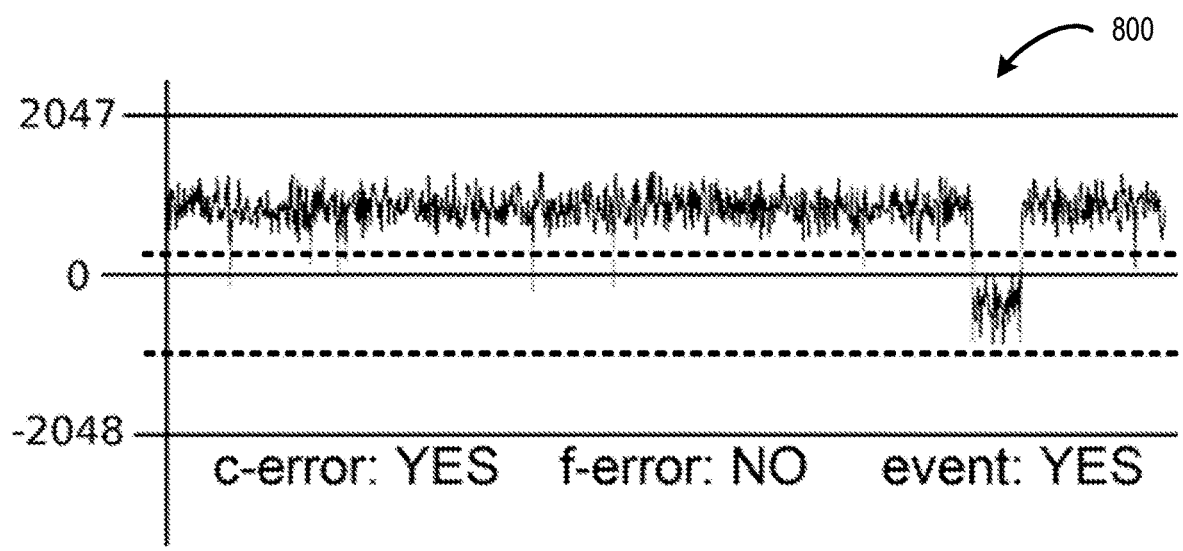

FIG. 8 show an example graph 800 where the ceiling threshold is positioned just above the zero axis and the floor threshold is positioned below the zero axis. In this example, the magnitudes of the digital signals remain mostly above the ceiling threshold and fall within the guard bands for at least one sample in approximately seven occasions within the frame. In the final occasion, the magnitude of the digital signal remains between the ceiling and floor thresholds for a plurality of samples near the end of the frame. In this example, the frame includes multiple ceiling errors, no floor errors, and the frame is flagged as an event due to the change in error status between adjacent signals on multiple occasions.

Figure 9:
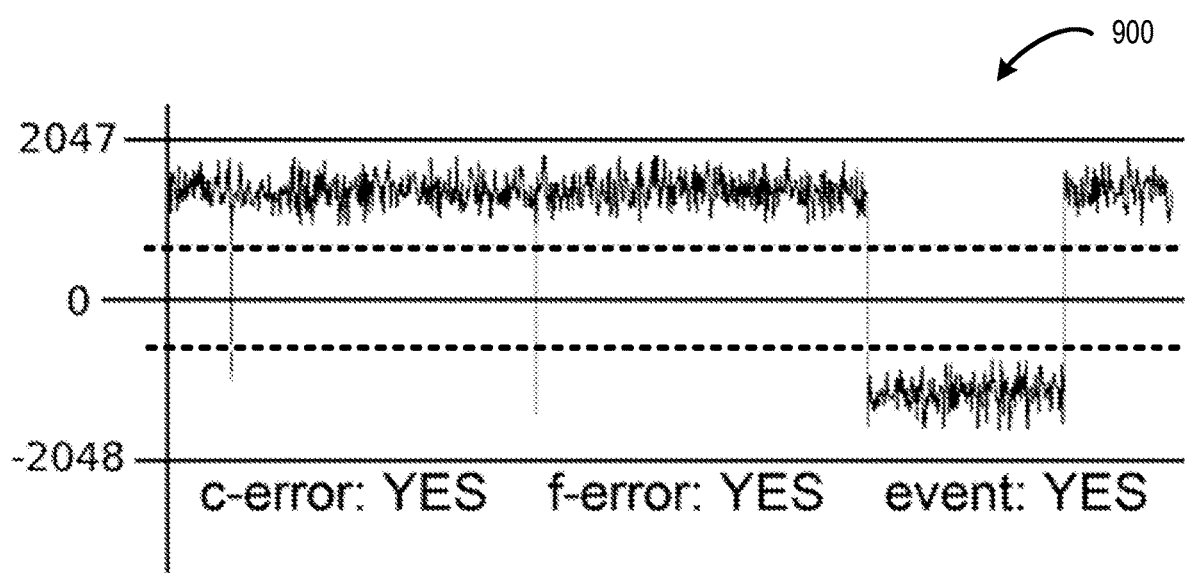

FIG. 9 show an example graph 900 where the ceiling threshold is positioned above the zero axis and the floor threshold is positioned below the zero axis. In this example, the magnitudes of the digital signals remain outside of the guard band, such that every sample is either a ceiling error or a floor error. Even though every sample is an error, because there are transitions between ceiling errors and floor errors the frame is flagged as an event.

Figure 10:
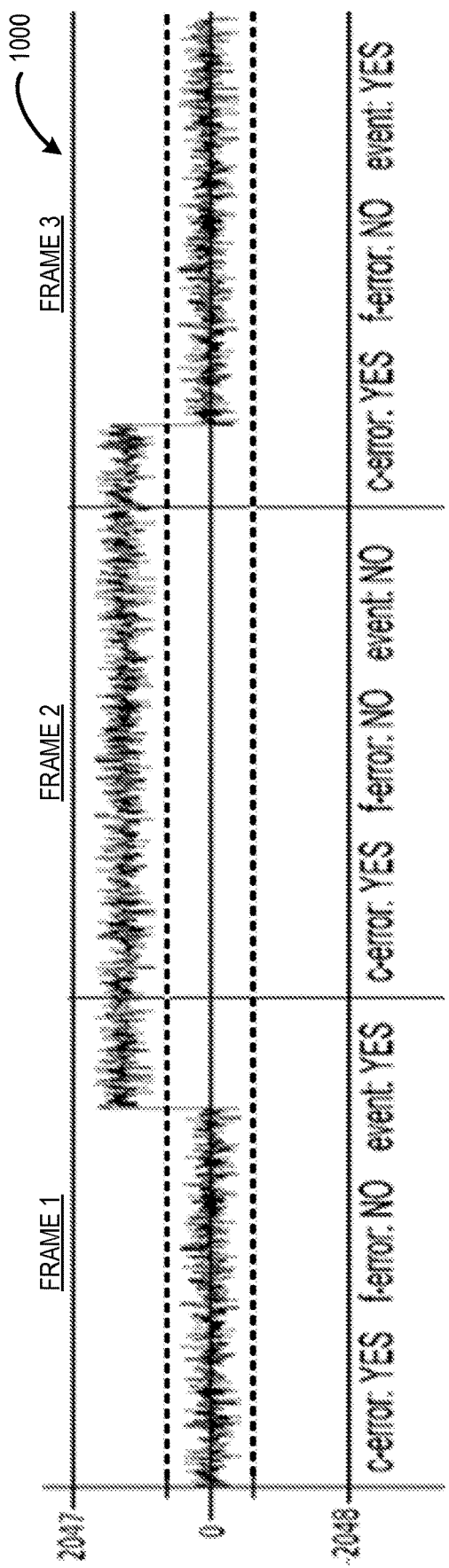
FIGS. 10-11 show example graphs of errors/events that occur across multiple frames and are detectable by the event detection engine of FIG. 2.
Figure 11:
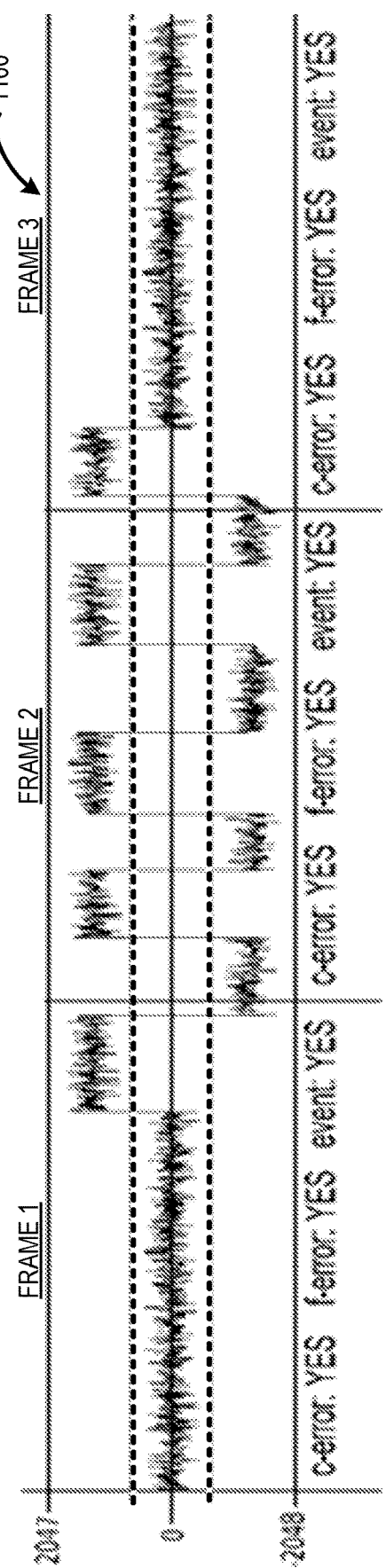

FIGS. 10-11 show example graphs of errors/events that occur across multiple frames and are detectable by the event detection engine 104. FIG. 10 shows an example graph 1000 that includes a plurality of samples that are output from the ADC 102 across three frames. In the first frame, the magnitudes of the digital signal remain within the guard bands for most of the frame. Toward the end of the first frame, the magnitudes of the digital signals rise above the ceiling threshold causing ceiling errors. The first frame does not include any floor errors. The transition of the samples from being inside the guard bands to above the ceiling threshold causes the first frame to be flagged as including an event. In the second frame, the magnitudes of the digital signal remain above the ceiling threshold for the entire frame: so the second frame is not flagged as including an event, because there is no change in error status between adjacent samples. In the third frame, the magnitudes of the digital signals start out above the ceiling threshold and then transition down in between the guard bands. The transition of the samples from being above the ceiling threshold to in between the guard bands causes the third frame to be flagged as including an event. In this example, the first and third frames are flagged as including events and the second frame does not include an event.

FIG. 11 shows an example graph 1100 that also includes a plurality of samples that are output from the ADC 102 across three frames. In the first frame, the magnitudes of the digital signal remain within the guard bands for most of the frame. Toward the end of the first frame, the magnitudes of the digital signals rise above the ceiling threshold causing ceiling errors; after which, they fall below the floor threshold causing floor errors. The transition of the samples from being inside the guard bands to above the ceiling threshold to below the floor threshold causes the first frame to be flagged as including an event. In the second frame, the magnitudes of the digital signal keep exhibiting a "ringing" effect in which the digital signals transition back and forth between ceiling errors and floor errors, without any samples actually being in between the guard bands. The second frame is flagged as including an event because adjacent samples have different error statuses. In the third frame, the magnitudes of the digital signals start out below the floor threshold; then transition above the ceiling threshold, and then relapse back down in between the guard bands. The transition of the samples from being below the floor threshold, then above the ceiling threshold, then in between the guard bands causes the third frame to be flagged as including an event. In this example, all three frames are flagged as including an event.

Returning to FIG. 2, the event detection engine 104 includes an internal memory block 210 located on-chip on the integrated circuit 106. The event detection engine 104 may be configured to log events using the internal memory 210 via different modalities, either programmably in the same implementation, or depending on the embodiment.

In one embodiment, the event detection engine 104 is configured to log event data according to a time-domain data-log mode. This mode is used to execute a bulk recording of all of the samples produced by the ADC 102 for a designated time window based on the detection of an error. The event detection engine 104 includes a data log memory controller 212 that is configured to store signal data 110 (e.g., magnitude values of digital signals) received from the ADC 102 into a data log SRAM memory 214, based on the error signal 202 indicating that an error has occurred in a frame. Once the data-log mode has been selected, and gets triggered based on the error signal 202, the data log memory controller 212 stores every sample of every frame in the data log SRAM memory 214 until the capacity of the data log SRAM memory 214 is reached. In some examples, the storage operation repeats itself from the origin memory address, in a revolving fashion, over and over again as desired to log samples of digital signals for radiation event detection analysis.

Owing to the revolving memory recording system in this data-log mode, the data log memory controller 212 is configured to determine a position of the origin memory address at which samples start being stored in the data log SRAM memory 214 based at least on an error signature of the event that occurred within the frame. The error signature of an event is often defined by the magnitudes of digital signals leading up to, and then following, an error. In some embodiments, the data log memory controller 212 may designate the origin memory address at one of three memory location in the data log SRAM memory 214 based on the error signature. In particular, the data log memory controller 212 may designate the origin memory address at the first memory address in the data log SRAM memory 214 (e.g., at address 1 of an 8K SRAM memory); or, at a center address in the data log SRAM memory 214 (e.g., at address 4K of an 8K SRAM memory); or, at the last address in the data log SRAM memory 214 (e.g., at address 8K of an 8K SRAM memory). Storing signal data starting at these various origin memory addresses (before, across, and after the instant of threshold violation) can assist an operator in capturing the most relevant signal data for the corresponding event, in order to perform their analysis in a comprehensive fashion.

Most error events are preceded and followed by samples that is desirable to analyze, and thus the center memory address typically would be designated as the origin memory address based on the error signature of such events. However, some events may have signatures that make the first or last memory addresses more suitable to be designated as the origin memory address. In one example, magnitudes of digital signals related to a radiation event may surge quickly to their acme, and then be followed by a long tail. In this example, the first memory address may be designated as the origin memory address to store the magnitude of the digital signal that triggered an error, so that all of the samples that follow the peak error can be logged in memory and analyzed. In another example, an event may have a long build-up, and a sudden decay. In this example, the last memory address may be designated as the origin memory address to store the magnitude of the digital signal that triggered the error, so that all of the samples leading up to the peak error can be logged in memory and analyzed.

In all of these examples, ADC signal data 110 corresponding to an event, also referred to as event data, are stored in their time-domain entirety in the internal memory 210 located on the integrated circuit 106. The event data includes a magnitude of the digital signal associated with a detected single-event error, magnitudes of digital signals that lead up to the digital signal associated with the detected single-event error and/or magnitudes of digital signals that follow the digital signal associated with the detected single-event error. The availability of a revolving memory record that gets assembled by storing this detailed event data enables an operator to analyze the SEEs in detail. The usefulness of punctually logging these samples according to the data-log mode is countered by the drawback of the observation time lost when transferring said data from the internal memory 210 to an off-chip processing/visualizing host, via a JTAG configuration and control module 222.

In another embodiment, the event detection engine 104 is configured to log event data according to an event counting mode that is more storage efficient than the data-log mode, but provides less detailed information about a detected event. The counting mode is used for collecting data relative to multiple detected events all in a single run, foregoing the verbatim recording of events, in favor of a longer-term summary and a running count. The event detection engine 104 is configured to store event data for a frame in the internal memory based at least on the event signal 208 output from the event detector 206, indicating that an event occurred within the frame. More particularly, the event detection engine 104 includes a counting memory controller 216 that is configured to receive the event signal 208 output by the event detector 206. The counting memory controller 216 is configured to trigger the counting mode based on the event signal 208 indicating an event has occurred in a frame. Each event occurrence within a frame triggers the storage of summarized event data 220 including three elements of information within a counting SRAM memory 218 of the internal memory 210. In particular, the event data 220 stored in the counting SRAM memory 218 includes all the ceiling errors of the frame (e.g., coded as 1 bit per sample—YES or NO error, totaling e.g., 128 bits for the frame); all the floor errors of the frame (also e.g., 128 bits, but flagging violations in the opposite direction); and a timestamp of the absolute number of frames that have elapsed since the counting mode was initially triggered. The timestamps are generated by a timestamp module 224, usually implemented with a very large mantissa.

The counting mode can be run until all the memory in the counting SRAM memory 218 has been filled. This latter mode provides a notional knowledge of the shape of an event, reconstructing the up/down trajectory of a SEE but without any precise magnitude information. Yet, the event data stored in the counting mode can allow an analyst to identify whether an event is monotonic, characterized as ringing in nature, or has another type of signature. Moreover, the counting mode is able to efficiently log event data, even for very long upsets that would otherwise immediately fill the memory if captured in data-log mode. This is due to only having to store a beginning and an ending timestamp, and a trailing and/or leading string of values (e.g., 1 vs. 0 markers).

The examples shown below document an example series of SEE transients detected and time-stamped on a time-interleaved ADC. The sequence contains the frame count timestamp (@ 128 samples per frame) converted into a wide decimal, followed by ceiling-errors and floor errors.

Timestamp: 21464937095
00000000000000000000000000000000000000000000
00001011001000000000000
00000000000000000000000000000000000000000000
00000000001000001000000000

Timestamp: 54517476167
0000000000000000000000000000000000000000
0000000000000000000000
0000000000000000000000000000000000000000
000000000000000000010000
Timestamp: 62793565064
0000000000000000000000000000000000000000
0001000000000000000000
0000000000000000000000000000000000000000
0000000000000000000000000
Timestamp: 64831280509
0000000000000000000000000000000000000000
0000000000000000000000
0000000100000000000000000000000000000000
0000000000000000000000000
Timestamp: 75136266719
0000000000000000000000000000000000000000
0000000000000000000000
0000000000000000000000000000000000000000
00000000000001000000000000

The example sequence indicates that a radiation strikes initially caused some ringing transient effects that caused both floor and ceiling errors; which are followed by a series of rarefied and well time-resolved single-bit errors distributed between ceiling and floor errors. This radiation event data is detected and stored in real time on-chip without any off-line interval, or degradation of duty-cycle in the capture process on the ADC. The counting mode can even operate in real time for state-of-the-art ADCs that operate at speeds of 10 Giga samples/s or more.

Figure 12:
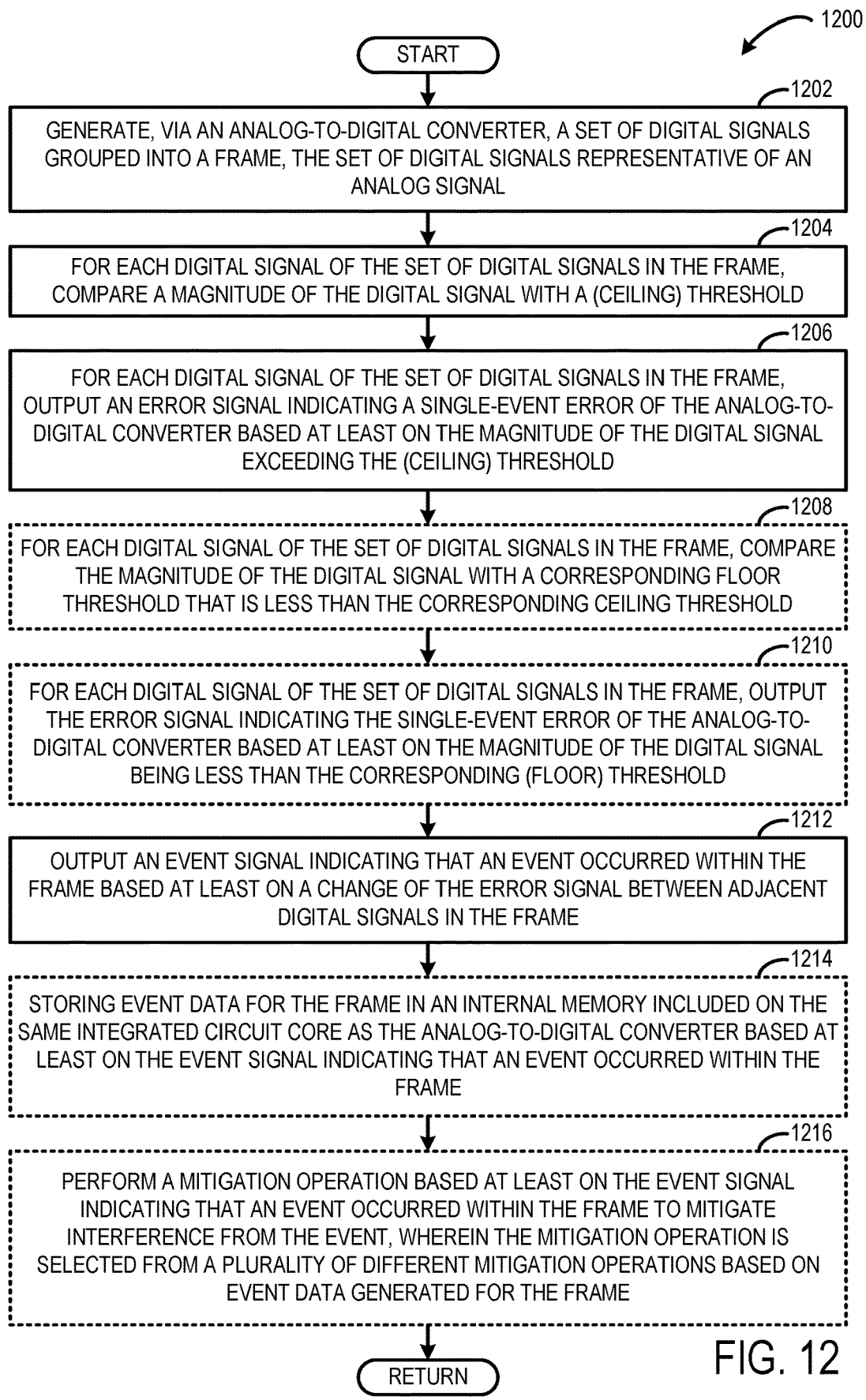
FIG. 12 shows an example method for detecting single event effects on an analog-to-digital converter.

FIG. 12 shows an example method 1200 for detecting single event effects on an ADC. For example, the method 1200 may be performed by the event detection engine 104 of FIGS. 1-2. Note that method steps that may be optionally performed in some embodiments are indicated by dotted lines.

At 1202, the method 1200 includes generating, via an analog-to-digital converter, a set of digital signals grouped into a frame. The set of digital signals are representative of an analog signal received by the analog-to-digital converter.

At 1204, the method 1200 includes, for each digital signal of the set of digital signals in the frame, comparing a magnitude of the digital signal with a threshold.

At 1206, the method 1200 includes, for each digital signal of the set of digital signals in the frame, outputting an error signal indicating a single-event error of the analog-to-digital converter based at least on the magnitude of the digital signal exceeding the threshold.

In some embodiments, each digital signal is compared to multiple thresholds. In such embodiments, the first threshold corresponds to a ceiling threshold. Further, at 1208, the method 1200 optionally may include, for each digital signal of the set of digital signals in the frame, comparing the magnitude of the digital signal with a corresponding floor threshold that is less than the corresponding ceiling threshold. At 1210, the method 1200 optionally may include, for each digital signal of the set of digital signals in the frame, outputting the error signal indicating the single-event error of the analog-to-digital converter based at least on the magnitude of the digital signal being less than the corresponding floor threshold.

At 1212, the method 1200 includes outputting an event signal indicating that an event occurred within the frame based at least on a change of the error signal between adjacent digital signals in the frame.

In some embodiments, at 1214, the method 1200 optionally may include storing event data for the frame in an internal memory included on the same integrated circuit as the analog-to-digital converter based at least on the event signal indicating that an event occurred within the frame.

In some embodiments, the event detection engine may operate in a data log mode in which the event data stored in the internal memory includes a magnitude of the digital signal associated with the detected single-event error, magnitudes of digital signals that lead up to the digital signal associated with the detected single-event error and/or magnitudes of digital signals that follow the digital signal associated with the detected single-event error. Further, the magnitude of the digital signal associated with the detected single-event error may be stored in a memory address that can be selected from a plurality of memory addresses of the internal memory based at least on an error signature of the event that occurred within the frame.

In other embodiments, the event detection engine may operate in a counting mode in which the event data stored in the internal memory includes summarized values indicating ceiling errors detected in the frame, values indicating floor errors detected in the frame, and a timestamp at which the event occurs within the frame, referenced to the start of the counting mode.

In some embodiments, at 1216, the method 1200 optionally may include performing a mitigation operation based at least on the event signal indicating that an event occurred within the frame, to mitigate disruption from the event. The mitigation operation may be selected from a plurality of different mitigation operations based on event data generated for the frame.

The method may be performed to process high speed ADC signal data in real time. Such real-time on-chip processing provides the technical benefit of increasing the observation time window of the ADC (e.g., virtually 100% of the allowable time) relative to a conventional approach, in which processing resources have to be dedicated to transferring ADC signal data off-chip to be batch processed by an FPGA or other suitable processing hardware. Furthermore, the real-time detection approach enables transparent radiation event background monitoring and statistics accumulation, for both radiation assurance purposes and radiation-induced error pattern classification and progressive machine-learning, leading to practical on-demand mitigation of the effects of the radiation events on the ADC.

In an example, an electronic device comprises an analog-to-digital converter configured to receive an analog signal and output a set of digital signals representative of the analog signal, and an event detection engine configured to receive the set of digital signals from the analog-to-digital converter, for each digital signal of the set of digital signals, 1) compare a magnitude of the digital signal with a threshold, and 2) output an error signal indicating a single-event error of the analog-to-digital converter based at least on the magnitude of the digital signal exceeding the threshold, wherein the analog-to-digital converter and the event detection engine are co-located on the same integrated circuit. In this example and/or other examples, the event detection engine may include a plurality of comparators corresponding to a number of digital signals in the set, and each comparator may be configured to compare the magnitude of the digital signal to the threshold, and output an error signal indicating an error based at least on the magnitude exceeding the threshold. In this example and/or other examples, the threshold may be a ceiling threshold, and the event detection engine may be configured to, for each digital signal of the set of digital signals, 1) compare the magnitude of the digital signal with a corresponding floor threshold that is less than the corresponding ceiling threshold, and 2) output the error signal indicating the single-event error of the analog-to-digital converter based at least on the magnitude of the digital signal being less than the corresponding floor threshold. In this example and/or other examples, the set of digital signals may be included in a frame, and the event detection engine may be configured to output an event signal indicating that an event occurred within the frame based at least on a change of the error signal between adjacent digital signals in the frame. In this example and/or other examples, the event detection engine may include an internal memory, and the event detection engine may be configured to store event data for the frame in the internal memory based at least on the event signal indicating that an event occurred within the frame. In this example and/or other examples, the event data may include a magnitude of the digital signal associated with the detected single-event error, magnitudes of digital signals that lead up to the digital signal associated with the detected single-event error, and/or magnitudes of digital signals that follow the digital signal associated with the detected single-event error. In this example and/or other examples, the internal memory may include a plurality of memory addresses, and the magnitude of the digital signal associated with the detected single-event error may be stored in a memory address selected from the plurality of memory addresses based at least on an error signature of the event that occurred within the frame. In this example and/or other examples, the event data may include values indicating ceiling errors detected in the frame, values indicating floor errors detected in the frame, and a timestamp at which the event occurs within the frame. In this example and/or other examples, the electronic device may further comprise an event mitigation engine configured to receive event data corresponding to the event and perform a mitigation operation based at least on the event data to mitigate disruption from the event. In this example and/or other examples, the event mitigation engine may include a lookup table configured to map event data corresponding to different types of events to different types of mitigation operations, and the event mitigation engine may provide the event data corresponding to the event as input to the lookup table and may perform the mitigation operation output from the lookup table based at least on the event data for the event detected by the event detection engine. In this example and/or other examples, the event mitigation engine may include a machine learning model previously trained to select a mitigation operation from a plurality of different mitigation operations based at least on event data corresponding to different types of events, and the event mitigation engine may perform the mitigation operation output from the machine learning model based at least on the event data for the event detected by the event detection engine.

In another example, a method for detecting a single event effect in an analog-to-digital converter comprises generating, via the analog-to-digital converter, a set of digital signals representative of an analog signal, the set of digital signals being grouped into a frame, for each digital signal of the set of digital signals in the frame, comparing a magnitude of the digital signal with a threshold, and outputting an error signal indicating a single-event error of the analog-to-digital converter based at least on the magnitude of the digital signal exceeding the threshold, and outputting an event signal indicating that an event occurred within the frame based at least on a change of the error signal between adjacent digital signals in the frame. In this example and/or other examples, the threshold may be a ceiling threshold, and the method further may comprise for each digital signal of the set of digital signals in the frame, comparing the magnitude of the digital signal with a corresponding floor threshold that is less than the corresponding ceiling threshold; and outputting the error signal indicating the single-event error of the analog-to-digital converter based at least on the magnitude of the digital signal being less than the corresponding floor threshold. In this example and/or other examples, the method may further comprise storing event data for the frame in an internal memory included on a same integrated circuit as the analog-to-digital converter based at least on the event signal indicating that an event occurred within the frame. In this example and/or other examples, the event data may include a magnitude of the digital signal associated with the detected single-event error, magnitudes of digital signals that lead up to the digital signal associated with the detected single-event error, and/or magnitudes of digital signals that follow the digital signal associated with the detected single-event error; and the internal memory may include a plurality of memory addresses, and the magnitude of the digital signal associated with the detected single-event error may be stored in a memory address selected from the plurality of memory addresses based at least on an error signature of the event that occurred within the frame. In this example and/or other examples, the event data may include values indicating ceiling errors detected in the frame, values indicating floor errors detected in the frame, and a timestamp at which the event occurs within the frame. In this example and/or other examples, the method may further comprise performing a mitigation operation based at least on the event signal indicating that an event occurred within the frame to mitigate disruption from the event, the mitigation operation may be selected from a plurality of different mitigation operations based on event data generated for the frame.

In yet another example, an electronic device comprises an analog-to-digital converter configured to receive an analog signal and output a set of digital signals representative of the analog signal, and an event detection engine configured to receive the set of digital signals from the analog-to-digital converter, for each digital signal of the set of digital signals, 1) compare a magnitude of the digital signal with a corresponding threshold, and 2) output an error signal indicating a single-event error of the analog-to-digital converter based at least on the magnitude of the digital signal exceeding the corresponding threshold, output an event signal indicating that an event occurred within the frame based at least on a change of the error signal between adjacent digital signals in the frame, and store event data for the frame in an internal memory of the event detection engine based at least on the event signal indicating that an event occurred within the frame, wherein the event data includes values indicating ceiling errors detected in the frame, values indicating floor errors detected in the frame, and a timestamp at which the event occurs within the frame. In this example and/or other examples, the event detection engine may include a plurality of comparators corresponding to a number of digital signals in the set, and each comparator may be configured to compare the magnitude of the digital signal to the threshold and output an error signal indicating an error based at least on the magnitude exceeding the threshold. In this example and/or other examples, the threshold may be a ceiling threshold, and the event detection engine may be configured to, for each digital signal of the set of digital signals, 1) compare the magnitude of the digital signal with a corresponding floor threshold that is less than the corresponding ceiling threshold, and 2) output the error signal indicating the single-event error of the analog-to-digital converter based at least on the magnitude of the digital signal being less than the corresponding floor threshold.

The present disclosure includes all novel and non-obvious combinations and subcombinations of the various features and techniques disclosed herein. The various features and techniques disclosed herein are not necessarily required of all examples of the present disclosure. Furthermore, the various features and techniques disclosed herein may define patentable subject matter apart from the disclosed examples and may find utility in other implementations not expressly disclosed herein.

The invention claimed is:

1. An electronic device comprising:
   an analog-to-digital converter configured to receive an analog signal and output a set of digital signals representative of the analog signal; and
   an event detection engine configured to:
      receive the set of digital signals from the analog-to-digital converter,
      for each digital signal of the set of digital signals, 1) compare a magnitude of the digital signal with a threshold, and 2) output an error signal indicating a single-event error of the analog-to-digital converter based at least on the magnitude of the digital signal exceeding the threshold,
   wherein the analog-to-digital converter and the event detection engine are co-located on the same integrated circuit.

2. The electronic device of claim 1, wherein the event detection engine includes a plurality of comparators corresponding to a number of digital signals in the set, and wherein each comparator is configured to compare the magnitude of the digital signal to the threshold, and output an error signal indicating an error based at least on the magnitude exceeding the threshold.

3. The electronic device of claim 1, wherein the threshold is a ceiling threshold, and wherein the event detection engine is configured to, for each digital signal of the set of digital signals, 1) compare the magnitude of the digital signal with a corresponding floor threshold that is less than the corresponding ceiling threshold, and 2) output the error signal indicating the single-event error of the analog-to-digital converter based at least on the magnitude of the digital signal being less than the corresponding floor threshold.

4. The electronic device of claim 1, wherein the set of digital signals is included in a frame, and wherein the event detection engine is configured to output an event signal indicating that an event occurred within the frame based at least on a change of the error signal between adjacent digital signals in the frame.

5. The electronic device of claim 4, wherein the event detection engine includes an internal memory, and wherein the event detection engine is configured to store event data for the frame in the internal memory based at least on the event signal indicating that an event occurred within the frame.

6. The electronic device of claim 5, wherein the event data includes a magnitude of the digital signal associated with the detected single-event error, magnitudes of digital signals that lead up to the digital signal associated with the detected single-event error, and/or magnitudes of digital signals that follow the digital signal associated with the detected single-event error.

7. The electronic device of claim 6, wherein the internal memory includes a plurality of memory addresses, and wherein the magnitude of the digital signal associated with the detected single-event error is stored in a memory address selected from the plurality of memory addresses based at least on an error signature of the event that occurred within the frame.

8. The electronic device of claim 6, wherein the event data includes values indicating ceiling errors detected in the frame, values indicating floor errors detected in the frame, and a timestamp at which the event occurs within the frame.

9. The electronic device of claim 5, further comprising:
   an event mitigation engine configured to receive event data corresponding to the event and perform a mitigation operation based at least on the event data to mitigate disruption from the event.

10. The electronic device of claim 9, wherein the event mitigation engine includes a lookup table configured to map event data corresponding to different types of events to different types of mitigation operations, and wherein the event mitigation engine provides the event data corresponding to the event as input to the lookup table and performs the mitigation operation output from the lookup table based at least on the event data for the event detected by the event detection engine.

11. The electronic device of claim 9, wherein the event mitigation engine includes a machine learning model previously trained to select a mitigation operation from a plurality of different mitigation operations based at least on event data corresponding to different types of events, and wherein the event mitigation engine performs the mitigation operation output from the machine learning model based at least on the event data for the event detected by the event detection engine.

12. A method for detecting a single event effect in an analog-to-digital converter, the method comprising:
   generating, via the analog-to-digital converter, a set of digital signals representative of an analog signal, the set of digital signals being grouped into a frame;
   for each digital signal of the set of digital signals in the frame,
      comparing a magnitude of the digital signal with a threshold; and
      outputting an error signal indicating a single-event error of the analog-to-digital converter based at least on the magnitude of the digital signal exceeding the threshold; and
   outputting an event signal indicating that an event occurred within the frame based at least on a change of the error signal between adjacent digital signals in the frame.

13. The method of claim 12, wherein the threshold is a ceiling threshold, and wherein the method further comprises:
   for each digital signal of the set of digital signals in the frame,
      comparing the magnitude of the digital signal with a corresponding floor threshold that is less than the corresponding ceiling threshold; and
      outputting the error signal indicating the single-event error of the analog-to-digital converter based at least on the magnitude of the digital signal being less than the corresponding floor threshold.

14. The method of claim 12, further comprising:
   storing event data for the frame in an internal memory included on a same integrated circuit as the analog-to-digital converter based at least on the event signal indicating that an event occurred within the frame.

15. The method of claim 14, wherein the event data includes a magnitude of the digital signal associated with the detected single-event error, magnitudes of digital signals that lead up to the digital signal associated with the detected single-event error, and/or magnitudes of digital signals that follow the digital signal associated with the detected single-event error; and wherein the internal memory includes a plurality of memory addresses, and wherein the magnitude of the digital signal associated with the detected single-event error is stored in a memory address selected from the plurality of memory addresses based at least on an error signature of the event that occurred within the frame.

16. The method of claim 14, wherein the event data includes values indicating ceiling errors detected in the frame, values indicating floor errors detected in the frame, and a timestamp at which the event occurs within the frame.

17. The method of claim 12, further comprising:
performing a mitigation operation based at least on the event signal indicating that an event occurred within the frame to mitigate disruption from the event, wherein the mitigation operation is selected from a plurality of different mitigation operations based on event data generated for the frame.

18. An electronic device comprising:
an analog-to-digital converter configured to receive an analog signal and output a set of digital signals representative of the analog signal; and
an event detection engine configured to:
receive the set of digital signals from the analog-to-digital converter,
for each digital signal of the set of digital signals, 1) compare a magnitude of the digital signal with a corresponding threshold, and 2) output an error signal indicating a single-event error of the analog-to-digital converter based at least on the magnitude of the digital signal exceeding the corresponding threshold,
output an event signal indicating that an event occurred within the frame based at least on a change of the error signal between adjacent digital signals in the frame, and
store event data for the frame in an internal memory of the event detection engine based at least on the event signal indicating that an event occurred within the frame, wherein the event data includes values indicating ceiling errors detected in the frame, values indicating floor errors detected in the frame, and a timestamp at which the event occurs within the frame.

19. The electronic device of claim 18, wherein the event detection engine includes a plurality of comparators corresponding to a number of digital signals in the set, and wherein each comparator is configured to compare the magnitude of the digital signal to the threshold and output an error signal indicating an error based at least on the magnitude exceeding the threshold.

20. The electronic device of claim 18, wherein the threshold is a ceiling threshold, and wherein the event detection engine is configured to, for each digital signal of the set of digital signals, 1) compare the magnitude of the digital signal with a corresponding floor threshold that is less than the corresponding ceiling threshold, and 2) output the error signal indicating the single-event error of the analog-to-digital converter based at least on the magnitude of the digital signal being less than the corresponding floor threshold.

* * * * *